United States Patent [19]

Davis et al.

[11] 4,225,854
[45] Sep. 30, 1980

[54] HIGH DENSITY ANALOG-TO-BINARY CODED DECIMAL CONVERTER

[75] Inventors: William F. Davis; Howard G. Shumway, both of Tempe, Ariz.

[73] Assignee: Motorola, Inc., Schaumburg, Ill.

[21] Appl. No.: 836,631

[22] Filed: Sep. 26, 1977

[51] Int. Cl.$^2$ ............................................. H03K 13/02
[52] U.S. Cl. .................... 340/347 AD; 340/347 M; 357/92
[58] Field of Search .................. 340/347 M, 347 AD; 324/99 D; 357/92

[56] References Cited

U.S. PATENT DOCUMENTS

| 3,142,056 | 7/1964 | Martin et al. | 340/347 AD |
| 3,537,101 | 10/1970 | Campanella et al. | 340/347 AD |

OTHER PUBLICATIONS

Hart et al., Bipolar LSI Takes a New Direction, Electronics, Oct. 3, 1974, pp. 111-118.

*Primary Examiner*—Thomas J. Sloyan
*Attorney, Agent, or Firm*—Maurice J. Jones, Jr.

[57] ABSTRACT

The combination of integrated injection logic (I$^2$L) and linear circuitry permits fabrication of a highly dense analog-to-binary coded decimal (A-to-BCD) converter. The heart of the A-to-BCD converter is a linear-I$^2$L plurality of high density variable current sinks which are proportional to each other in combination with I$^2$L gating techniques. These variable current sinks, when used in combination with the I$^2$L constant current sources, current sensing means, and I$^2$L logic, provide a highly dense A-to-BCD converter.

6 Claims, 3 Drawing Figures

| DECIMAL STATE | OUTPUTS | | | | NPN TRANSISTORS | | | | | | | | |
|---|---|---|---|---|---|---|---|---|---|---|---|---|---|
| | $\bar{D}$ | $\bar{C}$ | $\bar{B}$ | $\bar{A}$ | 42 | 46 | 50 | 54 | 58 | 62 | 66 | 70 | 74 |
| 0 | 1 | 1 | 1 | 1 | - | - | - | - | - | - | - | - | - |
| 1 | 1 | 1 | 1 | 0 | - | - | - | - | - | - | - | - | + |
| 2 | 1 | 1 | 0 | 1 | - | - | - | - | - | - | - | + | - |
| 3 | 1 | 1 | 0 | 0 | - | - | - | - | - | - | + | + | - |
| 4 | 1 | 0 | 1 | 1 | - | - | - | - | - | + | - | - | - |
| 5 | 1 | 0 | 1 | 0 | - | - | - | - | + | + | - | - | - |
| 6 | 1 | 0 | 0 | 1 | - | - | - | + | - | + | - | - | - |
| 7 | 1 | 0 | 0 | 0 | - | - | + | + | - | + | - | - | - |
| 8 | 0 | 1 | 1 | 1 | - | + | - | - | - | - | - | - | - |
| 9 | 0 | 1 | 1 | 0 | + | + | - | - | - | - | - | - | - |

HIGH DENSITY ANALOG-TO-BINARY CODED DECIMAL CONVERTER

BACKGROUND OF THE INVENTION

This invention relates, in general, to analog-to-digital converters and, more particularly, to monolithic integrated analog-to-binary-coded converters having $I^2L$-linear circuitry.

Analog-to-digital (A-to-D) converters and, more particularly analog-to-binary coded decimal (A-to-BCD) converters, are widely used in the electronics industry for quantizing analog voltages to discrete levels thereby permitting further processing utilizing digital circuitry. As more thoroughly discussed in a copending application of William F. Davis entitled HIGH DENSITY ANALOG-TO-DIGITAL CONVERTER AND METHOD OF CONSTRUCTION, Ser. No. 836,632, and assigned to the same assignee as the present application, it is highly desirable to achieve an A-t0-BCD conversion utilizing circuitry which is simple in concept, requires only a few devices, and requires a relatively small amount of semiconductor substrate area.

SUMMARY OF THE INVENTION

Accordingly, it is an object of this invention to provide an improved integrable analog-to-binary coded decimal converter which is relatively simple in concept.

It is another object of this invention to provide an integrable analog-to-binary coded decimal converter which consists of a relatively few electronic parts.

Yet another object of this invention is to provide an integrable A-to-BCD converter which uses high density integrated injection logic ($I^2L$) in combination with linear circuitry.

It is also an object of this invention to provide an integrable A-to-BCD converter which requires a minimal amount of semiconductor chip area.

An illustrated embodiment of the invention provides a highly compact analog-to-binary coded decimal converter having an analog input terminal and four output terminals comprising, first, a plurality of fixed current sources. In addition, a like number of variable current sinks, each one coupled to one of the fixed current sources to form a fixed-variable current pair with each of the variable current sinks capable of passing current at a fixed ratio to each other. Also provided is a means for varying the current passing through each of the variable current sinks in response to an analog input voltage at the analog input terminal, means for sensing relative currents from the fixed current sink and the variable current source in each of the fixed-variable current pairs, and means for indicating at the output terminals in a binary coded decimal format whether the current capacity of the fixed current source is greater or less than the capacity of the variable current sink in each of the fixed-variable current pairs.

DESCRIPTION OF THE PREFERRED EMBODIMENT

Figures 1, 3:
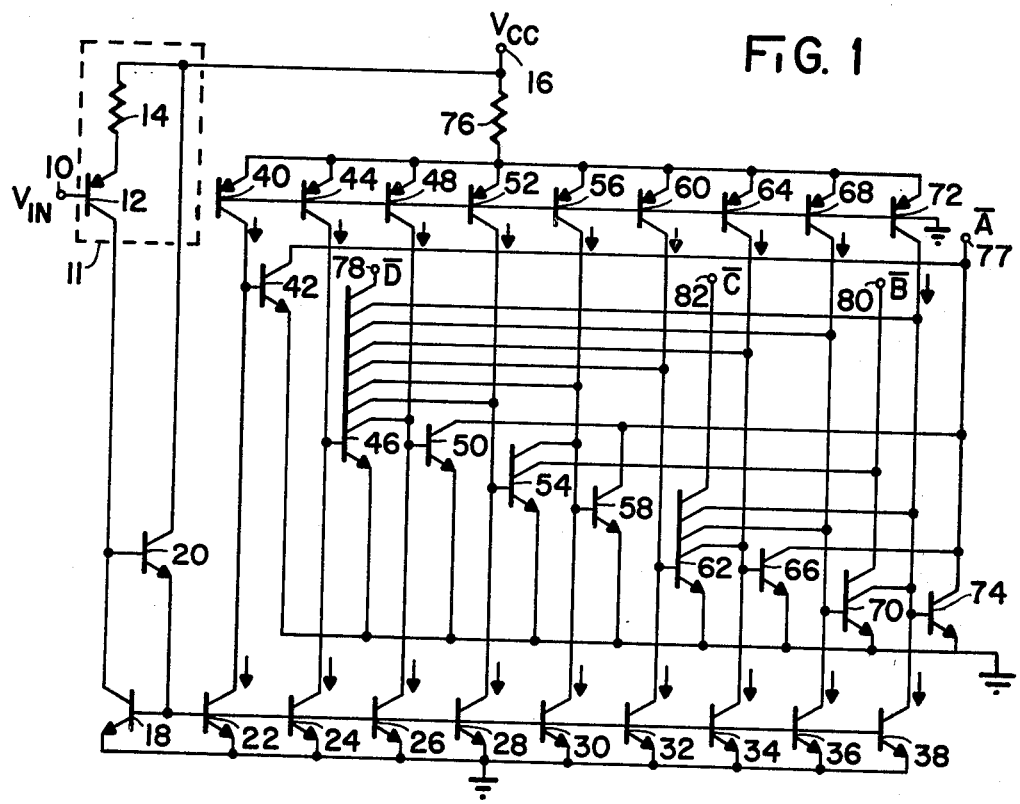
FIG. 1 is a circuit diagram of an embodiment of an analog-to-binary coded decimal converter.
FIG. 3 is a table of the output logic states and the conduction state of the output transistors of the embodiment shown in FIG. 1.

Now, referring to FIG. 1, input terminal 10 for receiving an analog voltage is connected to the input of an analog voltage to analog current linear transformation circuit 11. For illustrative purposes, linear transformation circuit 11 is shown as PNP transistor 12 and resistor 14. Input terminal 10 is connected to the base of PNP transistor 12, the emitter of which is connected to resistor 14 which, in turn, is connected to a positive DC supply voltage, $V_{CC}$, at terminal 16. The collector of transistor 12 is, in turn, connected to the collector of NPN transistor 18 and also to the base of NPN transistor 20. Transistor 18 has a common base with NPN transistors 22, 24, 26, 28, 30, 32, 34, 36, and 38, and also has an emitter in common with these transistors which is connected to ground or a reference potential. The collector of transistor 20 is connected to VCC and the emitter is connected to the base of transistor 18. The collector of transistor 22 is connected to the collector of PNP fixed current source transistor 40 and also to the base of NPN single collector transistor 42. In a similar manner, the collector of transistor 24 is connected to the collector of PNP fixed current source transistor 44 and to the base of NPN eight collector transistor 46; the collector of transistor 26 is connected to the collector of PNP fixed current source transistor 48 and to the base of NPN single collector transistor 50; the collector of transistor 28 is connected to the collector of PNP fixed current source transistor 52 and to the base of NPN dual collector transistor 54; the collector of transistor 30 is connected to the collector of PNP fixed current source transistor 56 and to the base of NPN single collector transistor 58; the collector of transistor 32 is connected to the collector of PNP fixed current source transistor 60 and to the base of NPN four collector transistor 62; the collector of transistor 34 is connected to the collector of PNP fixed current source transistor 64 and to the base of NPN single collector transistor 66; the collector of transistor 36 is connected to the collector of PNP fixed current source transistor 68 and to the base of NPN dual collector transistor 70; and the collector of transistor 38 is connected to the collector of PNP fixed current source transistor 72 and to the base of NPN single collector transistor 74. PNP fixed current source transistors 40, 44, 48, 52, 56, 60, 64, 68, and 72 have a common base node which is connected to ground and a common emitter node which is connected to one side of resistor 76, the other side of which is connected to the positive DC supply voltage, VCC, at terminal 16. Each of NPN single and multiple collector transistors 42, 46, 50, 54, 58, 62, 66, 70, and 74 have a common emitter connection which is connected to ground. The single collector of NPN transistor 42 is connected to $\overline{A}$ output terminal 77 and also connected to the single collector of NPN transistor 50, the single collector of NPN transistor 58, the single collector of NPN transistor 66, and the single collector of NPN transistor 74. The first collector of NPN transistor 46 forms a $\overline{D}$ output terminal 78; the second collector is connected to the collector of PNP fixed current source transistor 72; the third collector is connected to the collector of PNP fixed current source transistor 68; the fourth collector is connected to the collector of PNP fixed current source transistor 64; the fifth collector is connected to the collector of PNP fixed current source transistor 60; the sixth collector is connected to the collector of PNP fixed current source transistor 56; the seventh collector is connected to the collector of PNP fixed current source transistor 52; and the eighth collector is connected to the collector of PNP fixed current source transistor 48. The first collector of NPN dual collector transistor 54 is connected to the collector of PNP fixed current source transistor 56. The second collector of NPN dual collector transistor 54 is connected to the $\overline{B}$ output terminal 80 and also connected to the first collector of NPN dual collector transistor 70. The first collector of NPN four collector transistor 62 is connected to the $\overline{C}$ output terminal 82; the second collector is connected to the collector of PNP fixed current source transistor 72; the third collector is connected to the collector of PNP fixed current transistor 68; and the fourth collector is connected to the collector of PNP fixed current source transistor 64. Finally, the second collector of NPN dual collector transistor 70 is connected to the collector of PNP fixed current source transistor 72.

In operation, an analog voltage at input terminal 10 determines, via the voltage to current linear transformation circuit 11 which in this embodiment employs transistor 12 to provide the current through resistor 14 which, in turn, determines the current through transistor 18, the magnitude of which is reflected into each of the variable current sink transistors 22, 24, 26, 28, 30, 32, 34, 36, and 38. That is, the current in the collector of transistor 18 is mirrored in a proportional amount by each of the variable current source transistors. Transistor 20 acts as a buffer and a current amplifier to provide sufficient base drive for each of the variable current source transistors and to minimize loading on the collector current of transistor 18. Also, each of the variable current sink transistors have a proportional amount of current sinking capability. Thus, if transistor 38 is sinking one unit of current, transistor 36 will have a two unit capability, transistor 34 will have a three unit capability, transistor 32 will have four unit capability, transistor 30 will have a five unit capability, transistor 28 will have a six unit capability, transistor 26 will have a seven unit capability, transistor 24 will have a eight unit capability, and transistor 22 will have a nine unit capability. Supplying current to these variable current sinks is a series of fixed current sources comprised of transistors 40, 44, 48, 52, 56, 60, 64, 68, and 72. These transistors, together with resistor 76, which determines the amount of injector current for the fixed current sources, provide a fixed current for each of the variable current sinks and for the NPN single and multiple collector transistors 42, 46, 50, 54, 58, 62, 66, 70, and 74. Each of the fixed current sources is paired with one of the variable current sink transistors to form a fixed and variable current pair. When the current supplied by the fixed current source is greater than the current being absorbed by the variable current sink or being removed by another transistor by an amount sufficient to provide enough base drive to force the output transistor into saturation, then the output transistor will pull an output voltage low. However, as the variable current sink capacity increases to become greater than that current supplied by the fixed current supply source, then the output transistor will be robbed of its base drive, and will be unable to sink an output load. Also, if another transistor is saturated and removing current from the fixed current source transistor, then the NPN single or multiple collector transistor will be without any base drive. Thus, when the analog input voltage at terminal 10 is at a low level, the output current of circuit 11 is at a maximum demonstrated by turning on transistor 12 fully which in turn supplies a large amount of collector current to transistor 18. All the variable current sink transistors will be conducting and will take all the current from each of the fixed current source transistors to thereby remove base current from all the NPN single and multiple collector transistors. Each of the output terminals $\overline{A}$, $\overline{B}$, $\overline{C}$, and $\overline{D}$, at terminals 77, 80, 82, and 78, respectively, will be unable to sink current which represents high level outputs. As the analog voltage at terminal 10 increases, to in turn, decrease the current through transistor 12 and thus into the collector of transistor 18, then the variable current sink transistors will have less current sinking capability and at some point each of the variable current sources will be unable to sink the current from the fixed current sources. Thus, transistor 38, which has the least current sinking capability, will be the first to be unable to sink the current from the fixed current source transistor 72, and NPN single collector transistor 74 will go into conduction, thereby pulling the $\overline{A}$ output at terminal 77 to the low state. As the analog voltage at input terminal 10 is increased further, than the variable current sink transistor 36 will be unable to sink all the current from the fixed current source transistor 68, and dual collector NPN transistor 70 will conduct which will, in turn, pull the $\overline{B}$ output at terminal 80 to the low state but will also sink current from the fixed current source transistor 72 to remove the base current of NPN single collector of transistor 74. Thus, the $\overline{A}$ output at terminal 77 will be at a high level and the $\overline{B}$ output at terminal 80 will be at a low level representing the binary number two. As the input voltage is increased further, the variable current sink transistor 34 will not sink enough current to keep the single collector output transistor 66 from coming into conduction. The collector of the NPN single collector transistor 66 will pull the $\overline{A}$ output terminal to the low state to represent the binary number three. When variable current sink transistor 32 is unable to sink current in the fixed current source transistor 60, the NPN four collector transistor 62 will conduct to pull the $\overline{C}$ output at terminal 80 low and to also remove base current from each of NPN transistors 66, 70, and 74. Thus, the binary number four will be represented at the $\overline{A}$, $\overline{B}$, $\overline{C}$, and $\overline{D}$ output terminals. As the input voltage at 10 is increased further, the variable current sink transistor 30 will become less conductive thereby enabling the single collector output transistor 58 to go into conduction, which in turn will pull the $\overline{A}$ output terminal to the low state to represent the binary number five. As the variable current sink transistor 28 also becomes unable to sink current from the fixed current source transistor 52 and NPN dual collector transistor 54 goes into conduction, then the $\overline{B}$ output will be pulled low by one collector of transistor 54 and NPN transistor 58 will be disabled by the second collector of NPN transistor 54 to allow the $\overline{A}$ output to float high to thus represent the binary number six. As the input voltage at terminal 10 continues to increase, the variable current sink transistor 26 will conduct less until it is unable to sink all the current from the fixed current source transistor 48 and thereby turn on NPN single collector transistor 50 which, in turn, pulls the $\overline{A}$ output low to represent the binary number seven. As variable current sink transistor 24 becomes less conductive to thereby turn on the NPN eight collector transistor 46, the $\overline{D}$ output terminal 78 will be pulled low and each of the preceding NPN transistors 50, 54, 58, 62, 66, 70, and 74 will be robbed of their base drive current by each of the remaining seven collectors of NPN transistor 46. Thus, the binary number eight will be represented on the output terminals. Finally, as the input voltage at terminal 10 rises to force transistor 22 into non-conduction such that the NPN single collector transistor 42 becomes conductive, then the $\overline{A}$ output will be pulled low and the binary representation of the number nine will appear at the output terminals. Thus, it is seen that as the input voltage is increased the output state of $\overline{A}$, $\overline{B}$, $\overline{C}$, and $\overline{D}$ terminals proceeds from the binary zero to the binary nine state. In this manner, the A-to-BCD conversion is accomplished with relatively few devices in a straightforward uncomplicated manner.

Figure 2:
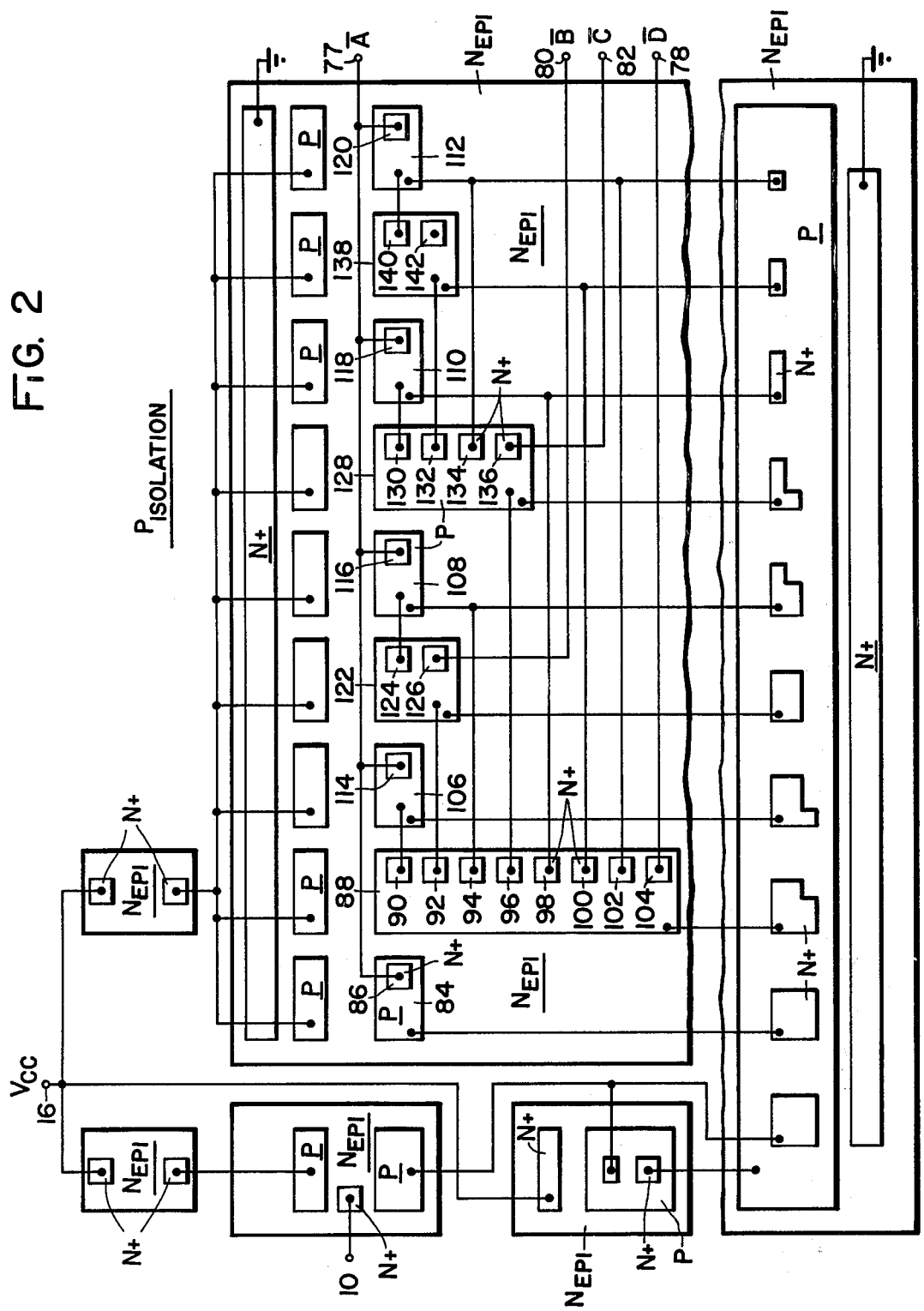
FIG. 2 is a representation of a circuit layout on a monolithic semiconductor substrate to produce a circuit shown in FIG. 1.

FIG. 2 is a diagram of a layout on a monolithic semiconductor substrate of the circuit of FIG. 1. The layout is essentially identical to the layout of co-pending application, Ser. No. 836,632, "HIGH DENSITY ANALOG-TO-DIGITAL CONVERTER AND METHOD OF CONSTRUCTION", except that the collector regions of the PNP fixed current source transistors have been modified to accommodate the additional collectors of NPN transistors 46, 54, 62, and 70, of FIG. 1. That is, the collector of PNP fixed current source transistor 40 and the base of NPN single collector transistor 42 are located in region 84 and the collector of NPN transistor 42 is located in region 86. The structure for the NPN single collector transistors 42, 50, 58, 66, and 74 is identical to the structure of the aforementioned co-pending application. However, the collector of PNP fixed current source transistor 44 and the base of the NPN eight collector transistor 46 has been enlarged to accommodate the eight collectors which are comprised of the N+ diffusions 90, 92, 94, 96, 98, 100, 102, and 104. Similarly, the base and the collector regions for NPN single collector transistors 50, 58, 66, and 74 are represented by P diffusions 106, 108, 110, and 112 respectively for the base regions of the NPN transistors, and by N+ regions 114, 116, 118, and 120 respectively for the collectors of the NPN single collector transistors. The base region of the dual collector NPN transistor 54 is a P region 122 of FIG. 2 and the collectors are the N+ regions 124 and 126. The base region for NPN four collector transistor 62 is a P region 128 with N+ regions 130, 132, 134, and 136 representing the four collectors of NPN transistor 62. Finally, the base of the NPN dual collector transistor 70 is laid out as P region 138 with N+ regions 140 and 142 as the collector regions for NPN transistor 70. These regions are then interconnected, as shown in FIG. 2, by metallization to realize the desired $\overline{A}$, $\overline{B}$, $\overline{C}$, and $\overline{D}$ output states as previously described.

This circuit construction, using I²L techniques in combination with linear circuitry and logic interconnections, results in a considerable savings of chip area on a semiconductor substrate. The variable current sinks region results in a significant savings as compared to the same variable current sink implementation using conventional transistors which ratio the emitter-to-base contact area. Also, the combination of a fixed current source transistor and the output transistors into a single region results in more savings of semiconductor substrate area. In addition the N epi regions with fixed current sources could be combined with the epi region containing the variable current sink since the epi regions are both grounded.

FIG. 3 is a table of the output states for the $\overline{A}$, $\overline{B}$, $\overline{C}$, and $\overline{D}$ outputs of the circuit of FIG. 1 for each of the ten decimal states of the A-to-BCD converter together with a list of the NPN single and multiple collector transistors indicating for each of the decimal states whether they are conducting or non-conducting. This BCD output format provides conventional BCD data to the digital processing circuitry, thus saving any conversion circuitry necessary to convert the domino sequence output of the aforementioned co-pending application to normal binary data.

Although the analog voltage to analog current linear transformation circuit 11 in the preferred embodiment is shown as PNP transistor 12 and resistor 14, it will be understood by those skilled in the art that the linear transformation circuit 11 may be any of various types of such circuits.

This analog-to-binary coded decimal conversion technique and circuit is relatively simple in concept and involves comparatively few electronic parts. Moreover, the combination of I²L circuitry and linear circuitry results in a considerable savings of chip area on a semiconductor substrate.

While the invention has been particularly shown and described with reference to preferred embodiments thereof, it will be understood by those skilled in the art that various changes may be made therein without departing from the teachings of the invention. Therefore, it is intended in the appended claims to cover all such equivalent variations as come within the spirit and scope of the invention.

What is claimed is:

1. An analog to binary coded decimal converter having an input terminal for receiving analog signals and four output terminals for providing a digital representation of the analog signal in a binary coded decimal format comprising:
   (a) first through ninth I²L gates each having an input and at least one output;
   (b) first through ninth variable current sinks each having an output coupled to said input of said first through ninth I²L gates respectively for sinking a specific variable maximum amount of current in response to the magnitude of said analog signal, said specific maximum amount of current of each of said first through ninth current sinks having a predetermined ratio to each other;
   (c) conductive means interconnecting a plurality of said outputs of said I²L gates with said inputs of said I²L gates; and
   (d) each of said gate and sink combinations respectively having a source of current associated therewith to selectively enable each of the gates whereby an output signal having a binary coded decimal format is provided at the four output terminals.

2. An analog to binary coded decimal converter as set forth in claim 1 wherein:
   (a) said first, third, fifth, seventh, and ninth I²L gates have a single output;
   (b) said second I²L gate has first through seventh outputs;
   (c) said fourth and eighth I²L gates each have a first and second output; and
   (d) said sixth I²L gate has first through fourth outputs.

3. An analog to binary coded decimal converter as set forth in claim 2 wherein,:

(a) said first variable current sink sinks a specific maximum amount of current substantially equal to nine times that of said ninth variable current sink; and (b) said second, third, fourth, fifth, sixth, seventh, and eighth variable current sinks sink a specific maximum amount of current substantially equal to eight, seven, six, five, four, three, and two times respectively of said ninth variable current sink.

4. An analog to binary coded decimal converter as set forth in claim 3 wherein said interconnections of said plurality of said outputs of said I$^2$L gates with said inputs of said I$^2$L gates further comprises:

(a) interconnection of said output of said first I$^2$L gate with said output of said third I$^2$L gate with said output of said fifth I$^2$L gate, with said output of said seventh I$^2$L gate, and with said output of said ninth I$^2$L gate, and further with a first output terminal for providing the least significant bit of binary coded decimal data output;

(b) interconnection of said first output of said second I$^2$L with a fourth output terminal for providing the most significant bit of binary coded decimal data output;

(c) interconnection of said second output of said second I$^2$L gate with said second output of said sixth I$^2$L gate, with said second output of said eighth I$^2$L gate, and with said input of said ninth I$^2$L gate;

(d) interconnection of said third output of said second I$^2$L gate with said third output of said sixth I$^2$L gate and with said input of said eighth I$^2$L gate;

(e) interconnection of said fourth output of said second I$^2$L gate with said fourth output of said sixth I$^2$L gate, and said input of said seventh I$^2$L gate ;

(f) interconnection of said fifth output of said second I$^2$L gate with said input of said sixth I$^2$L gate;

(g) interconnection of said sixth output of said second I$^2$L gate with said first output of said fourth I$^2$L gate and with said input of said fifth I$^2$L gate;

(h) interconnection of said seventh output of said second I$^2$L gate with said input of said fourth I$^2$L gate;

(i) interconnection of said eighth output of said second I$^2$L gate with said input of said third I$^2$L gate;

(j) interconnection of said second output of said fourth I$^2$L gate with said first output of said eighth I$^2$L gate and with a second output terminal for providing the second least significant bit of binary coded decimal data output; and (k) interconnection of said first output of said sixth I$^2$L with a third output terminal for providing the second most significant bit of binary coded decimal data output.

5. An analog-to-digital converter having an analog input terminal adapted to receive an analog input signal and a plurality of output terminals at which a binary signal indicative of the magnitude of the analog signal is provided comprising:

(a) a plurality of fixed current sources for providing currents having constant magnitudes;

(b) a plurality of variable current circuits each coupled to one of said fixed current sources to form a plurality of fixed and variable current pairs, said variable current circuits being adapted to pass currents having different maximum magnitudes, said different maximum magnitudes being in a fixed ratio to each other;

(c) control means coupled to each of said variable current circuits for simultaneously varying the maximum magnitude of the current which can pass through each of said plurality of variable current circuits, said variation being in response to and related to the magnitude of the analog input signal;

(d) a plurality of threshold detectors each coupled to each of said variable current circuits, said threshold detectors being responsive to the relative magnitude of the constant current from said fixed current source and said maximum current of said variable current circuit of each of said fixed and variable current pairs to provide the binary signals at the output terminals indicative of the magnitude of the analog input signal, said binary signals being indicative of whether the magnitude of the constant current of said fixed current source is greater than or less than the maximum magnitude of the current passing capacity of said variable current circuit in each of said fixed and variable current pairs; and (e) conductive means interconnecting said threshold detectors with each other and with said fixed and variable current pairs for providing a binary coded decimal representation at the output terminals of the analog-to-digital converter.

6. A highly compact analog-to-digital converter suitable for being provided in monolithic integrated circuit form, having an analog input terminal and a plurality of binary output terminals comprising:

(a) a semiconductor substrate;

(b) a first region disposed in said substrate, said first region comprising a plurality of I$^2$L gates each having a fixed injector current of a constant magnitude, an input node and at least one output node, wherein said output nodes form separate binary output terminals;

(c) a second region disposed in said substrate and comprising a plurality of variable high density current circuits, each of said current circuits having a different maximum current conducting capacity which is in a ratio to each of the other of said current circuits, and each current circuit having an output node coupled to said input node of each of said I$^2$L gates in said first region to selectively enable each of the I$^2$L gates as determined by the maximum current of each of said current circuits relative to said injector current;

(d) means for varying the maximum current conducting capacity of said variable high density current circuits in response to the magnitude of an analog input signal at the analog input terminal to cause an analog-to-digital conversion of said input signal; and (e) conductive means interconnecting said threshold detectors with each other and with said fixed and variable current pairs for providing a binary coded decimal representation at the output terminals of the analog-to-digital converter.

* * * * *